US010673001B2

(12) United States Patent
Niu et al.

(10) Patent No.: US 10,673,001 B2
(45) Date of Patent: Jun. 2, 2020

(54) FLEXIBLE DISPLAY SUBSTRATE, METHOD FOR FABRICATING THE SAME AND DISPLAY DEVICE

(71) Applicant: BOE TECHNOLOGY GROUP CO., LTD., Beijing (CN)

(72) Inventors: Yanan Niu, Beijing (CN); Chunyan Li, Beijing (CN); Hongwei Tian, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/344,272

(22) PCT Filed: May 9, 2018

(86) PCT No.: PCT/CN2018/086090
§ 371 (c)(1),
(2) Date: Apr. 23, 2019

(87) PCT Pub. No.: WO2018/214727
PCT Pub. Date: Nov. 29, 2018

(65) Prior Publication Data
US 2019/0273213 A1    Sep. 5, 2019

(30) Foreign Application Priority Data

May 25, 2017    (CN) .......................... 2017 1 0378410

(51) Int. Cl.
*H01L 51/00* (2006.01)
*G09F 9/30* (2006.01)
*H01L 27/12* (2006.01)

(52) U.S. Cl.
CPC .......... *H01L 51/0097* (2013.01); *G09F 9/301* (2013.01); *H01L 27/124* (2013.01);
(Continued)

(58) Field of Classification Search
CPC ............ H01L 51/0097; H01L 27/1259; H01L 27/1244; H01L 27/124; H01L 27/127; H01L 27/3276
See application file for complete search history.

(56) References Cited

U.S. PATENT DOCUMENTS 9,972,796 B2 * 5/2018 Kajiyama ........... H01L 51/0097
2015/0108484 A1 * 4/2015 Park ..................... H01L 27/1255
257/71

(Continued)

FOREIGN PATENT DOCUMENTS

CN    101826506 A    9/2010
CN    106340460 A    1/2017

(Continued)

OTHER PUBLICATIONS

International Search Report and Written Opinion of the International Searching Authority (with English language translation), International Application No. PCT/CN2018/086090, dated Aug. 17, 2018, 11 pp.

(Continued)

*Primary Examiner* — Kevin Quarterman
(74) *Attorney, Agent, or Firm* — Myers Bigel, P.A.

(57) ABSTRACT

A flexible display substrate is disclosed. The flexible display substrate includes a flexible substrate, a gate, a source and drain and a plurality of conductive wirings on the flexible substrate. Each conductive wiring is provided with a plurality of grooves in a bending area of the flexible display substrate, so that the damage resistance of the conductive wirings during bending is improved. A display device including the flexible display substrate and a method for fabricating the flexible display substrate are also disclosed.

13 Claims, 3 Drawing Sheets

(52) U.S. Cl.
CPC ........ *H01L 27/127* (2013.01); *H01L 27/1244* (2013.01); *H01L 27/1259* (2013.01)

(56) References Cited

U.S. PATENT DOCUMENTS

| | | | |
|---|---|---|---|
| 2017/0141179 A1* | 5/2017 | Kim | H01L 27/323 |
| 2017/0263690 A1* | 9/2017 | Lee | G02F 1/133305 |
| 2019/0273213 A1 | 9/2019 | Niu et al. | |

FOREIGN PATENT DOCUMENTS

| | | |
|---|---|---|
| CN | 106601133 A | 4/2017 |
| CN | 106601756 A | 4/2017 |
| CN | 106711172 A | 5/2017 |
| CN | 107170758 A | 9/2017 |
| KR | 1020160099934 A | 8/2016 |

OTHER PUBLICATIONS

First Office Action and English language translation, CN Application No. 201710378410.3, dated Feb. 22, 2019, 13 pp.
Second Office Action and English language translation, CN Application No. 201710378410.3, dated Jul. 16, 2019, 10 pp.

* cited by examiner

FLEXIBLE DISPLAY SUBSTRATE, METHOD FOR FABRICATING THE SAME AND DISPLAY DEVICE

CROSS REFERENCE TO RELATED APPLICATIONS

The present application is a 35 U.S.C. 371 national stage application of PCT International Application No. PCT/CN2018/086090, filed on May 9, 2018, which claims the benefit of Chinese Patent Application No. 201710378410.3, filed on May 25, 2017, the contents of which are incorporated herein by reference in their entireties. The above-referenced International Application was published in the Chinese language as International Application Publication No. WO 2018/214727 A1 on Nov. 29, 2018.

TECHNICAL FIELD

The present disclosure relates to the field of display technologies, and particularly to a flexible display substrate, a method for fabricating the flexible display substrate and a display device.

BACKGROUND

Organic Light Emitting Display (OLED) has gradually become the mainstream of display field with its excellent performances such as low power consumption, high color saturation, wide viewing angle, thin thickness and the ability to achieve flexibility, etc. At present, OLED has been used widely in terminal products such as smartphones, tablets, and televisions, etc. In order to achieve a narrow frame, bond pads are typically fabricated on one side of the substrate, and OLED is bent with very small radius. During bending, since the flexible display substrate still contains a large number of inorganic layers, these inorganic layers are prone to be damaged and cracked, further causing damage and crack of conductive wirings in OLED, and causing performance degradation or even failure of the flexible display substrate and the display device. Therefore, there is a need to improve the damage resistance during bending in the art.

SUMMARY

In a first aspect, an embodiment of the present disclosure provides a flexible display substrate, comprising: a flexible substrate, and a gate, a source and drain and a plurality of conductive wirings disposed on the flexible substrate, wherein each conductive wiring is provided with a plurality of grooves in a bending area of the flexible display substrate.

For example, the plurality of grooves in each conductive wiring are discontinuously distributed.

For example, the plurality of grooves in each conductive wiring are equally spaced along a length direction of the conductive wirings.

For example, the grooves have a depth which is 10-90% of a thickness of the conductive wirings.

For example, the grooves have a width which is 10-90% of a width of the conductive wirings.

For example, the conductive wirings are disposed in a same layer as the source and drain.

For example, the flexible display substrate further comprises an interlayer dielectric layer disposed between the gate and the source and drain, and a planarization layer covering the source and drain and the conductive wirings.

For example, the conductive wirings are disposed in a same layer as the gate.

In a second aspect, the embodiment of the present disclosure provides a display device, comprising the flexible display substrate as described above.

The display device according to an embodiment of the present disclosure has same or similar benefits as the flexible display substrate described above, and will not be described herein.

In a third aspect, the embodiment of the present disclosure provides a method for fabricating a flexible display substrate, comprising: preparing a flexible substrate; forming a gate, a source and drain and a plurality of conductive wirings on the flexible substrate; and in a bending area of the flexible display substrate, forming a plurality of grooves in each conductive wiring.

For example, the grooves have a depth which is 10-90% of a thickness of the conductive wirings.

For example, the grooves have a width which is 10-90% of a width of the conductive wirings.

For example, forming the gate, the source and drain and the plurality of conductive wirings on the flexible substrate comprises: at a same time as forming the source and drain, forming the plurality of conductive wirings.

For example, forming the gate, the source and drain and the plurality of conductive wirings on the flexible substrate comprises: at a same time as forming the gate, forming the plurality of conductive wirings.

The method for fabricating a flexible display substrate according to an embodiment of the present disclosure has same or similar benefits as the flexible display substrate described above, and will not be described herein.

BRIEF DESCRIPTION OF THE DRAWINGS

In order to illustrate the technical solutions in the embodiments of the present disclosure more clearly, the drawings of the embodiments will be briefly introduced below. It should be understood that the drawings described below are only related to some embodiments of the present disclosure and are not intended to limit the disclosure.

DETAILED DESCRIPTION OF EMBODIMENTS

Figure 1:
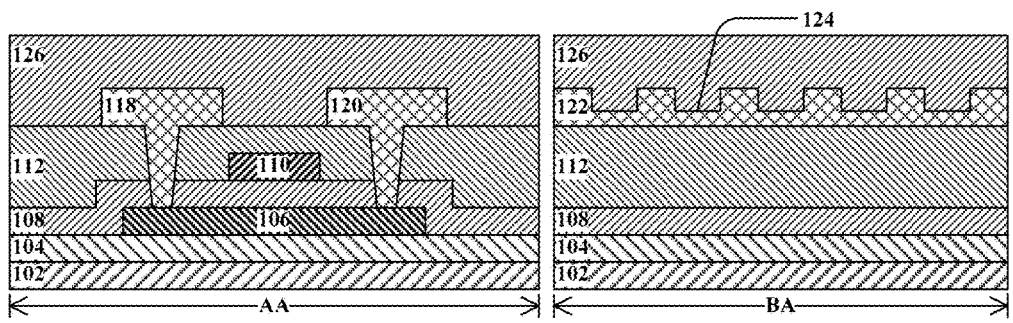
FIG. 1 is a schematic sectional view of a flexible display substrate in an embodiment of the present disclosure.

In order to make a person with ordinary skill in the art better understand the technical solutions of the embodiments of the present disclosure, the structures and principles of the embodiments of the present disclosure will be described in detail below with reference to the accompanying drawings.

The illustrated embodiments are only used to explain the present disclosure, and are not to be construed as limiting the disclosure.

Components shown in the drawings are labeled as follows: AA: active area; BA: bending area; 100: carrier substrate; 102: flexible substrate; 104: buffer layer; 106: active layer; 108: gate insulation layer; 110: gate; 112: interlayer dielectric layer; 114: source and drain conductive layer; 116: photoresist; 118: source; 120: drain; 122, 1221, 1222, 122m: data lines; 422: gate lines; 124, 1241, 1242, 1243, 1244, 124n, 424: grooves; 126: planarization layer; 510: first electrode; 520: pixel definition layer; 530: functional layer; 540: second electrode; dW: width direction of data lines; dL: length direction of the data lines.

Embodiments of the present disclosure provide a flexible display substrate with improved damage resistance during bending, a display device comprising the flexible display substrate and a method for fabricating the flexible display substrate, which intend to reduce or eliminate one or more drawbacks described above.

A flexible display substrate according to an embodiment of the present disclosure is described below with reference to FIG. 1. In an embodiment, as shown in FIG. 1, the flexible display substrate comprises a flexible substrate 102, and a gate 110, a source 118, a drain 120, and a plurality of conductive wirings (only one of which is shown in the figure) which are disposed on the flexible substrate 102. The flexible display substrate further comprises an active layer 106. The active layer 106, the gate 110, the source 118, and the drain 120 form a driving thin film transistor in the active area AA of the flexible display substrate. Each conductive wiring is provided with a plurality of grooves 124 in a bending area BA of the flexible display substrate.

In an embodiment, the active layer 106 is formed of low temperature polysilicon (LTPS). The carrier mobility of LTPS is increased significantly over amorphous silicon (a-Si). This effectively reduces the area of the TFT, increases the aperture ratio of the display device, and decreases the overall power consumption while improving the luminance of the display device. LTPS is typically prepared at a lower temperature by processes such as excimer laser crystallization (ELC), which facilitates the application of LTPS in the flexible display substrate and the display device. Forming the active layer 106 using LTPS is advantageous for improving response time, resolution, and display quality.

In an embodiment, the flexible display substrate further comprises a buffer layer 104 disposed between the flexible substrate 102 and the active layer 106. In an embodiment, the buffer layer 104 is a bilayer stack of silicon dioxide and silicon nitride, in which the bilayer stack comprises a silicon dioxide layer contacting the active layer 106 and a silicon nitride layer contacting the flexible substrate 102. The silicon dioxide facilitates the crystalline quality of the LTPS when forming the active layer 106 of the LTPS, and the silicon nitride blocks contaminants from the flexible substrate 102.

In an embodiment, the display substrate further comprises a gate insulation layer 108 disposed between the active layer 106 and the gate 110, and an interlayer dielectric layer 112 disposed between the gate 110 and the source 118 as well as the drain 120. In addition, the flexible display substrate further comprises a planarization layer 126 that covers the source 118, the drain 120, and the conductive wirings.

In an embodiment, the conductive wirings are data lines 122. As shown in FIG. 1, the data lines 122, the source 118 and the drain 120 are disposed in a same layer. The data lines 122 are provided with a plurality of grooves 124 in the bending area BA of the flexible display substrate.

Hereinafter, taking the flexible display substrate with the structure shown in FIG. 1 as an example, a fabrication process of the flexible display substrate is briefly described with reference to FIGS. 2A to 2H.

Figure 2A:
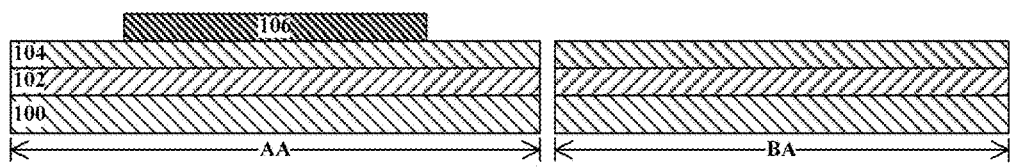
FIGS. 2A, 2B, 2C, 2D, 2E, 2F, 2G, 2H are schematic sectional views of a flexible display substrate at various stages of fabrication in an embodiment of the present disclosure.

As shown in FIG. 2A, a pattern of the active layer 106 is formed in the active area AA of the flexible substrate 102.

In an embodiment, a precursor of the flexible substrate is coated on a carrier substrate 100, and the precursor is formed into the flexible substrate 102 by processes such as drying and curing. For example, the carrier substrate 100 is a glass substrate, and the flexible substrate 102 is a flexible polyimide (PI) substrate.

In an embodiment, an amorphous silicon layer is formed on the flexible substrate 102, which amorphous silicon layer is converted into a polysilicon layer by processes such as excimer laser crystallization (ELC), and the polysilicon layer is patterned to form the pattern of the active layer 106.

As described above, in an embodiment, a buffer layer 104 is formed on the flexible substrate 102 prior to formation of the amorphous silicon layer. For example, the buffer layer 104 is a bilayer stack of silicon dioxide and silicon nitride, and has a total thickness of 200 nm to 500 nm.

The patterning processes herein comprise processes such as photoresist coating, exposure, development, etching, photoresist stripping, and the like. Since processes such as photoresist coating are known to the person with ordinary skill in the art, embodiments of the present disclosure do not specifically describe the processes of photoresist coating and the like when describing the patterning processes, but this does not mean that these processes do not exist or are omitted.

Figure 2B:
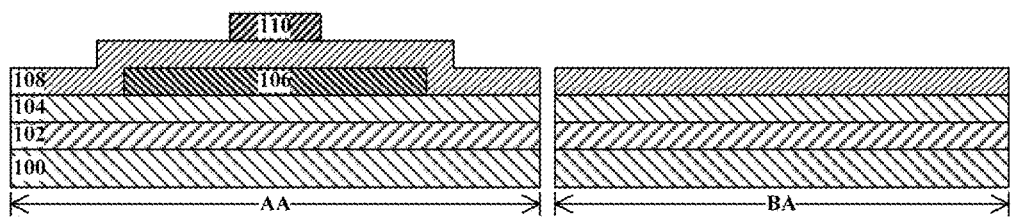

As shown in FIG. 2B, on the flexible substrate 102 on which the pattern of the active layer 106 has been formed, the gate insulation layer 108 is formed, and the pattern comprising the gate 110 is formed on the gate insulation layer 108 in the active area AA.

In an embodiment, the gate insulation layer 108 is deposited on the flexible substrate 102 on which the pattern of the active layer 106 is formed by a method such as plasma chemical vapor deposition, and the like. Next, a gate metal layer is formed on the gate insulation layer 108 by methods such as sputtering or evaporation and the like, and the gate metal layer is patterned to form the pattern of the gate 110 in the active area AA. In an embodiment, the gate insulation layer 108 comprises a bilayer stack.

In an alternative embodiment, the gate insulation layer and the gate metal layer are formed sequentially, and both the gate insulation layer and the gate metal layer are patterned to form a stack of the gate insulation layer and the gate in the active area AA. In addition, after the stack of the gate insulation layer and the gate is formed, plasma treatment is carried out on the exposed part of the active layer, which is advantageous for improving the electrical performance of the channel area of the subsequently formed thin film transistor.

Figure 2C:
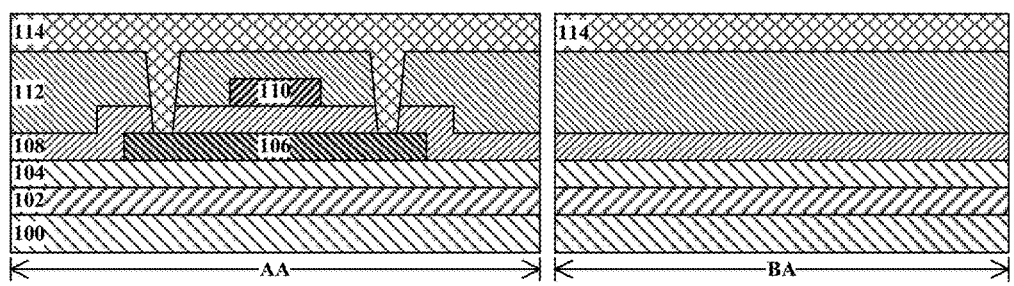

As shown in FIG. 2C, an interlayer dielectric layer 112 is formed, and a source and drain conductive layer 114 electrically connected to the active layer 106 is formed.

In an embodiment, the interlayer dielectric layer 112 covering the gate 110 and the gate insulation layer 108 is formed by methods such as plasma chemical vapor deposition or the like. The interlayer dielectric layer 112 is patterned to form contact holes running through the interlayer dielectric layer 112 and the gate insulation layer 108, causing the active layer 106 to be partially exposed. Next, the source and drain conductive layer 114 is formed by methods such as sputtering or evaporation, and the like. The source and drain conductive layer 114 is electrically connected to the active layer 106 through contact holes. In an embodiment, the interlayer dielectric layer 112 comprises a bilayer stack.

In an embodiment, the source and drain conductive layer 114 is a single layer or a stack formed by one or more of Mo, MoNb, Al, AlNd, Ti, and Cu. For example, the source and drain conductive layer 114 is a Ti/Al/Ti stack, and each layer has a thickness of 500 Å, 6500 Å, and 500 Å, respectively.

Figure 2D:
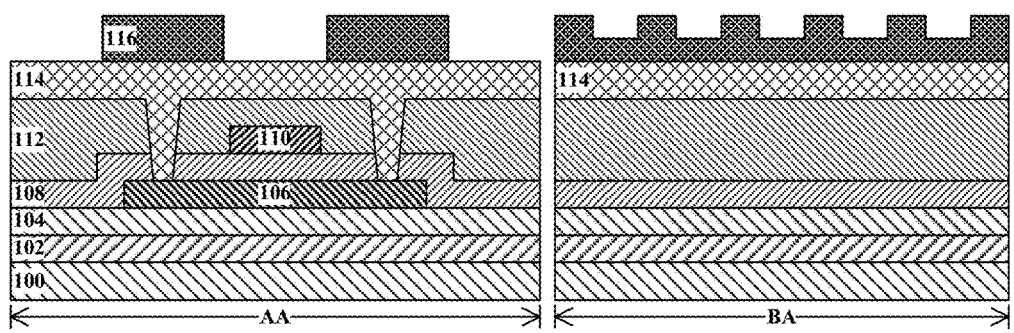

As shown in FIG. 2D, a patterned photoresist 116 is formed on the source and drain conductive layer 114.

In an embodiment, a photoresist is formed on the source and drain conductive layer 114. The photoresist is exposed by a gray tone mask to form a fully exposed area, a partially exposed area, and an unexposed area. The photoresist in the fully exposed area is removed, the photoresist in the partially exposed area is partially removed, and the photoresist in the unexposed area is completely retained. The patterned photoresist 116 thus obtained is shown in FIG. 2D.

Figure 2E:
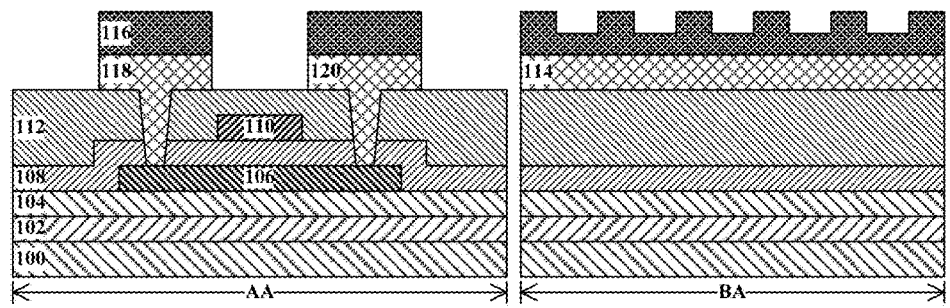

As shown in FIG. 2E, the source and drain conductive layer 114 corresponding to the fully exposed area is etched.

Figure 2F:
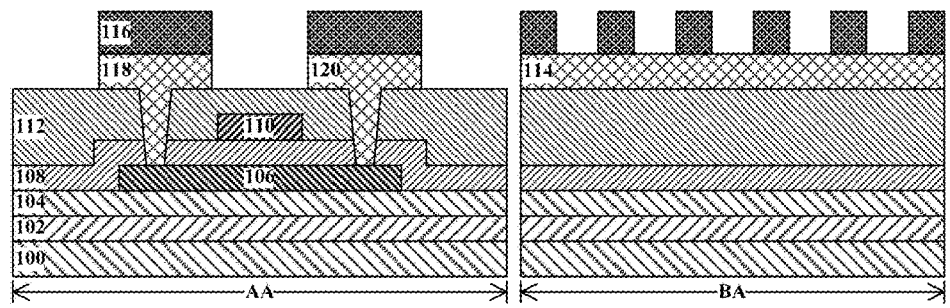

In an embodiment, by using the patterned photoresist 116 as a mask, the source and drain conductive layer 114 in the fully exposed area is removed by an etching process. Thereby, the source 118 and the drain 120 are formed in the active area AA. The source 118 and the drain 120 are electrically connected to the active layer 106 through contact holes running through the interlayer dielectric layer 112 and the gate insulation layer 108. As shown in FIG. 2F, the photoresist of the partially exposed area is removed by using a gray tone mask.

In an embodiment, by using a gray tone mask, the photoresist in the partially exposed area is removed, thereby exposing a portion of the source and drain conductive layer 114 in the bending area BA.

Figure 2G:
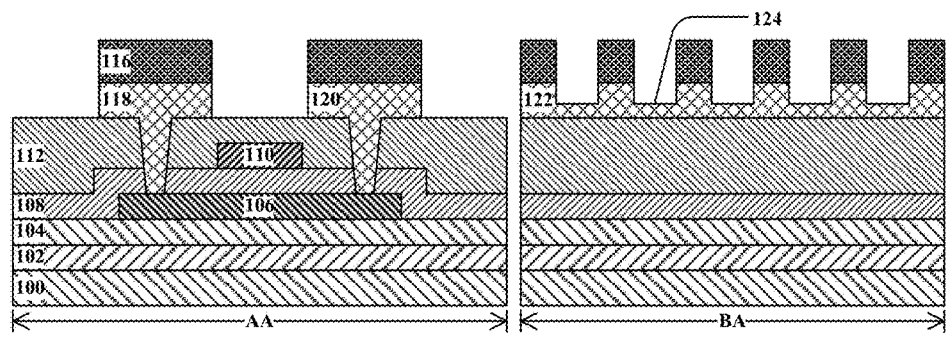

As shown in FIG. 2G, the source and drain conductive layer 114 corresponding to the partially exposed area is etched to form a plurality of grooves 124 in the bending area BA.

In an embodiment, by using the patterned photoresist 116 as a mask, the source and drain conductive layer 114 in the partially exposed area is partially removed by the etching process. Thus, a plurality of grooves 124 of the source and drain conductive layer 114 are formed in the bending area BA. The grooves 124 do not fully run through the source and drain conductive layer 114.

Figure 2H:
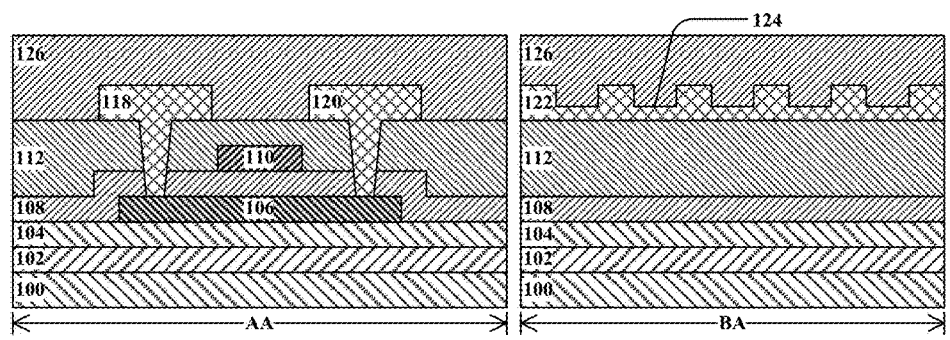

As shown in FIG. 2H, the photoresist 116 of the unexposed area is removed, and the planarization layer 126 is formed.

In an embodiment, the photoresist 116 of the unexposed area is removed, thereby forming the source 118 and the drain 120 of the thin film transistor in the active area AA of the flexible display substrate, and simultaneously forming conductive wirings with grooves in the bending area BA of the flexible display substrate. In this embodiment, the conductive wirings are data lines 122 disposed in a same layer as the source 118 and the drain 120, and the data lines 122 are provided with a plurality of grooves 124. The grooves 124 do not fully run through the data lines 122. In an embodiment, the grooves 124 have a depth which is 10-90%, e.g., 50%, of a thickness of the data line 122. It is advantageous that the grooves 124 do not to fully run through the data lines 122, because this reduces the likelihood of disconnection of the data lines 122.

As known to the person with ordinary skill in the art, "the source and drain and data lines are disposed in a same layer" means that a film is formed by using a same film forming process, and a patterning process is performed on the film to form the pattern of the source and drain and the data lines. Structurally, the source and drain and data lines are located at a same stack level among layers of the flexible display substrate. It should be noted that, the source and drain and data lines disposed in a same layer are not necessarily at a same distance from the flexible substrate.

In an embodiment, the planarization layer 126 is formed on the flexible display substrate to cover the source 118, the drain 120, and the data lines 122. The introduction of the planarization layer 126 helps to reduce or eliminate the steps introduced by the various device layers on the flexible substrate, thereby providing a relatively flat surface to the subsequently formed device layers. In an embodiment, the planarization layer 126 is formed of an organic resin. The organic resin fills the grooves 124 in the data lines 122, which increases the strength of the data lines 122 at the grooves 124.

In an embodiment, the planarization layer 126 is formed on the flexible display substrate by coating processes such as spin coating. In another embodiment, the planarization layer 126 is formed on the flexible display substrate by an inkjet printing process. In addition, when the planarization layer 126 is formed, for example, the above-described coating process or inkjet printing process is performed a plurality of times on the flexible display substrate. This facilitates the formation of the planarization layer 126 with a flatter surface.

Through the above-described process steps, the fabrication of the flexible display substrate of the embodiment of the present disclosure is completed. It should be noted that the carrier substrate 100 herein serves to provide support and protection for the flexible display substrate during fabrication. In an embodiment, the carrier substrate 100 is a glass substrate, and the flexible substrate 102 is a polyimide substrate. The flexible display substrate is stripped from the carrier substrate by, for example, a laser lift-off process.

In the above-described embodiments, taking a bottom gate type thin film transistor whose gate is located under the source and the drain as an example, the flexible display substrate is described. However, the embodiments of the present disclosure do not limit the type of structure of the thin film transistor. For example, the thin film transistor may be of a top gate type in which the gate is located above the source and the drain. Hereinafter, the grooves formed in conductive wirings are briefly described with reference to FIG. 3.

Figure 3:
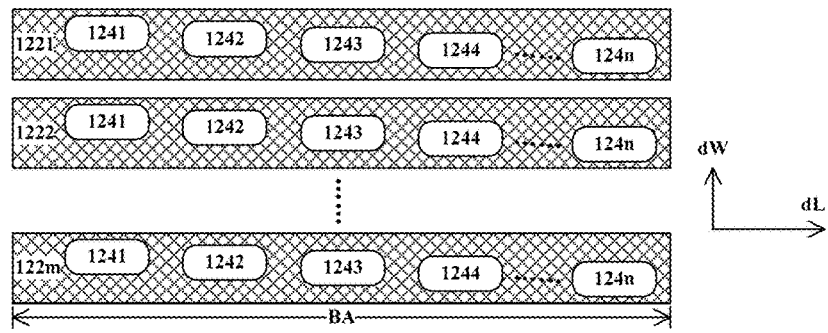
FIG. 3 is a schematic top view of a portion of a flexible display substrate in an embodiment of the present disclosure.

FIG. 3 schematically shows a plurality of conductive wirings formed by the above-described process steps. In this case, the conductive wirings are the data lines 122 disposed in a same layer as the source 118 and the drain 120 of the thin film transistor. As shown, in the bending area BA of the flexible display substrate, a plurality of grooves 1241, 1242, 1243, 1244 . . . 124n are formed on each data line 1221, 1222, . . . 122m.

In an embodiment, the grooves 1241, 1242, 1243, 1244 . . . 124n are discontinuously distributed in each data line 1221, 1222 . . . 122m. That is, these grooves are not adjacent to each other. Each data line is thinned at the position of the grooves, thereby forming thick parts and thin parts which are arranged alternately. This makes the data lines 122 more resistant to the impact caused by the damage and crack of the inorganic layer.

In an embodiment, the grooves 1241, 1242, 1243, 1244 . . . 124n are equally spaced along a length direction dL of the data lines 122 in each data line 1221, 1222 . . . 122m. This is advantageous for uniformly increasing the damage resistance of the data lines 122 during bending.

In an embodiment, the grooves 1241, 1242, 1243, 1244 . . . 124n have a width which is 10-90%, e.g., 50%, of a width of the data lines 122. The width is defined herein as the width along the width direction dW of the data lines 122. In this case, the grooves do not span the entire width of the data lines 122. For example, in the width direction dW of the data lines 122, at most one side of each groove is disposed adjacent to the edge of the data line.

This avoids the problem that the data lines may be damaged or cracked when the interfaces of the thick and thin parts of the data lines are parallel to the bending line.

The top view of FIG. 3 shows only one exemplary case of the spatial distribution and shape of the grooves in the data lines. The embodiments of the present disclosure do not constrain the spatial arrangement of the grooves in each data line. For example, in each data line, all of the grooves are distributed in a straight line along the length direction dL of the data lines, or are randomly distributed. For example, the grooves in different data lines are distributed according to same or different rules. For example, in the top view shown in FIG. 3, the shape of the grooves are any one of rectangle, rounded rectangle, square, rounded square, ellipse, and circle.

In the various embodiments described above with reference to FIGS. 1, 2A-2H, 3, the conductive wirings formed with grooves in the bending area BA are data lines disposed in a same layer as the source and drain of the thin film transistor. The conception of embodiments of the present disclosure is applicable to any conductive wiring that may be damaged and cracked when the flexible display substrate is repeatedly bent.

Hereinafter, a case in which the conductive wirings are gate lines disposed in a same layer as the gate of the thin film transistor is described with reference to FIG. 4.

Figure 4:
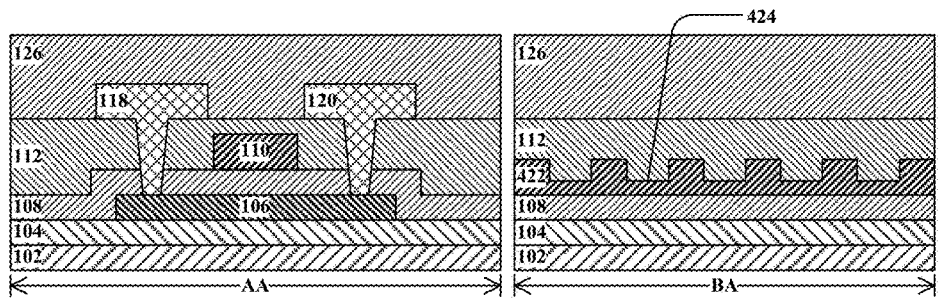
FIG. 4 is a schematic sectional view of a flexible display substrate in an embodiment of the present disclosure.

FIG. 4 describes a flexible display substrate in accordance with an embodiment of the present disclosure. In FIG. 4, same or similar reference numerals are used to indicate same or similar components as those of the flexible display substrate of FIG. 1, and the description of these components is omitted.

As shown in FIG. 4, the flexible display substrate comprises a plurality of conductive wirings (only one of them is shown in the figure), and each conductive wiring is provided with a plurality of grooves 424 in the bending area BA of the flexible display substrate. In an embodiment, the conductive wirings are gate lines 422 disposed in a same layer as the gate 110 of the thin film transistor in the flexible display substrate. The data lines 122 are provided with a plurality of grooves 424 in the bending area BA of the flexible display substrate. Similarly, the grooves 424 may be described with reference to the above description of the grooves 124. In this embodiment, the gate lines 422 and the gate 110 of the thin film transistor are formed by for example using a gray tone mask, as described above with reference to FIGS. 2C-2H.

In FIGS. 1 and 4, the cross-sectional shape of the grooves in the conductive wirings is exemplarily shown as a rectangle. In other embodiments, the cross-sectional shape of the grooves is, for example, an inverted trapezoid or an inverted triangle. It should be noted that the grooves of any cross-sectional shape disposed in the conductive wirings are advantageous for improving the damage resistance of the conductive wirings during bending.

Figure 5:
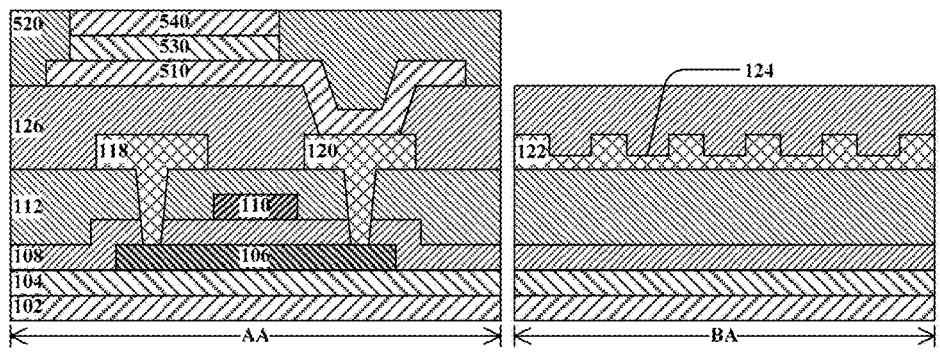
FIG. 5 is a schematic sectional view of a display device in an embodiment of the present disclosure.

Hereinafter, a display device according to one embodiment of the present disclosure will be described with reference to FIG. 5. As shown in FIG. 5, contact holes are formed in the flexible display substrate shown in FIG. 1, and run through the planarization layer 126 to partially expose the drain 120. Next, a metal layer is formed by a method such as sputtering or evaporation, and the first electrode 510 is formed by a patterning process. The first electrode 510 is electrically connected to the drain 120 through the contact holes. A pixel definition layer 520 is formed on the planarization layer 126 on which the first electrode 510 is formed, and a majority of the surface area of the first electrode 510 is exposed by a patterning process. Next, the functional layer 530 and the second electrode 540 are sequentially formed on the flexible display substrate on which the pixel definition layer 520 is formed. In an embodiment, the functional layer 530 comprises a hole injection layer, a hole transport layer, a light emitting layer, an electron transport layer, an electron injection layer, and the like. The first electrode 510, the functional layer 530, and the second electrode 540 form an OLED, thereby obtaining a display device.

In the above-described embodiment, the display device is described by taking an OLED as an example. However, the display device of the embodiment of the present disclosure is not limited thereto. In other embodiments, the display device is, for example, a thin film transistor liquid crystal display device (TFT LCD) using a flexible substrate. In this case, the process for fabricating the display device comprises the steps of dropping liquid crystal on the flexible display substrate shown in FIG. 1, and assembling with an opposed substrate such as a color filter substrate, and the like. These steps are well known to the person with ordinary skill in the art and will not be further described here.

The display device of the embodiment of the present disclosure may be any product or component with a display function, such as a liquid crystal panel, an electronic paper, a mobile phone, a tablet, a television, a display, a notebook computer, a digital photo frame, a navigator, or the like.

Figure 6:
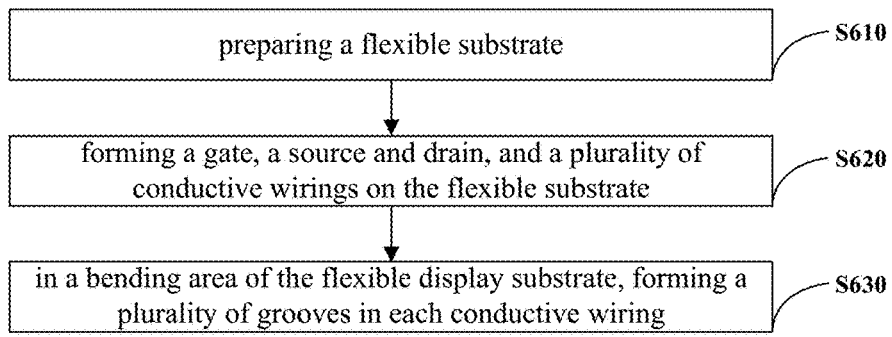
FIG. 6 is a schematic flowchart of a method for fabricating a flexible display substrate in an embodiment of the present disclosure.

Hereinafter, a method for fabricating a flexible display substrate according to an embodiment of the present disclosure will be described with reference to FIG. 6. As shown in FIG. 6, the method for fabricating a flexible display substrate comprises: step S610: preparing a flexible substrate; step S620: forming a gate, a source and drain, and a plurality of conductive wirings on the flexible substrate; and step S630: in a bending area of the flexible display substrate, forming a plurality of grooves in each conductive wiring.

In an embodiment, the grooves have a depth which is 10-90%, e.g., 50%, of a thickness of the conductive wirings.

In an embodiment, the grooves have a width which is 10-90%, e.g., 50%, of a width of the conductive wirings.

In an embodiment, forming the gate, the source and drain and the plurality of conductive wirings on the flexible substrate comprises: at a same time as forming the source and drain, forming the plurality of conductive wirings. Specific steps are described above, for example, with reference to FIGS. 2C-2H.

In an embodiment, forming the gate, the source and drain and the plurality of conductive wirings on the flexible substrate comprises: at a same time as forming the gate, forming the plurality of conductive wirings. Specific steps are described above, for example, with reference to FIGS. 2C-2H.

In the embodiments of the present disclosure, each conductive wiring is provided with a plurality of grooves in the bending area of the flexible display substrate. The purpose of the grooves is to introduce parts with different thicknesses (such as thick parts and thin parts described above) to the conductive wirings, so that the damage resistance of the conductive wirings is improved during bending. As the expressions used in the above described embodiments, the thin parts are referred to as grooves with respect to the thick parts. However, the thick parts are for example referred to as protrusions, with respect to the thin parts. Therefore, in the context of the present disclosure, "the conductive wirings are provided with grooves" may also be understood as "the conductive wirings are provided with protrusions".

In summary, the embodiments of the present disclosure provide a flexible display substrate, a method for fabricating the flexible display substrate, and a display device. The display substrate comprises a flexible substrate, a gate, a source and drain, and a plurality of conductive wirings disposed on the flexible substrate, in which each conductive wiring is provided with a plurality of grooves in the bending area of the flexible display substrate. Since each conductive wiring is provided with a plurality of grooves in the bending area of the flexible display substrate, the deformation of the flexible display substrate during bending is reduced, the deformation and crack of the inorganic layer are suppressed, and the damage resistance of the conductive wirings during bending is improved. This improves the bending resistance of the flexible display substrate and the reliability and life of the flexible display substrate and the display device.

It should be pointed out that in the drawings, the dimensions of layers and areas may be exaggerated for clarity. It is can be also understood that when an element or layer is referred to as "on" another element or layer, it may be directly on the other element or there may be an intermediate layer. In addition, it may be understood that when an element or layer is referred to as "under" another element or layer, it may be directly under the other element, or there may be one or more than one intermediate layer or element. In addition, it may be further understood that when a layer or element is referred to as "between" two layers or two elements, it may be the only layer between two layers or two elements, or there may be further on or more than one intermediate layer or element. Like reference numerals indicate like elements throughout. In the embodiments of the present disclosure, the terms "first", "second", and "third" are used for descriptive purposes only, and cannot be understood as indicating or implying relative importance.

The foregoing descriptions of the embodiments of the present disclosure are presented for purposes of illustration and description only. They are not intended to be exhaustive or to limit the contents of the embodiments of the present disclosure. Therefore, many adjustments and variations will be easily envisioned by the person with ordinary skill in the art and these adjustments and variations would fall within the protection scope of the embodiments of the present disclosure. In short, the protection scope of the embodiments of the present disclosure is defined by the appended claims.

The invention claimed is:

1. A flexible display substrate, comprising:
    a flexible substrate;
    a gate;
    a source and drain; and
    a plurality of conductive wirings on the flexible substrate, wherein each conductive wiring of the plurality of conductive wirings comprises a plurality of grooves in a bending area of the flexible display substrate,
    wherein in a direction perpendicular to a surface of the flexible substrate, each conductive wiring has a dimension at the plurality of grooves smaller than a dimension at a remaining region of the bending area, and
    wherein in a direction parallel with the surface of the flexible substrate and perpendicular to an extending direction of each conductive wiring, each conductive wiring has a constant dimension.

2. The flexible display substrate according to claim 1, wherein the plurality of grooves in each conductive wiring are discontinuously distributed.

3. The flexible display substrate according to claim 1, wherein the plurality of grooves in each conductive wiring are equally spaced along a length direction of the conductive wirings.

4. The flexible display substrate according to claim 1, wherein ones of the plurality of grooves have a depth which is 10%-90% of a thickness of the conductive wirings.

5. The flexible display substrate according to claim 1, wherein ones of the plurality of grooves have a width which is 10%-90% of a width of the conductive wirings.

6. The flexible display substrate according to claim 1, wherein the conductive wirings are in a same layer as the source and drain.

7. The flexible display substrate according to claim 1, wherein the conductive wirings are in a same layer as the gate.

8. The flexible display substrate according to claim 1, further comprising:
    an interlayer dielectric layer between the gate and the source and drain; and
    a planarization layer on the source and drain and the conductive wirings.

9. A display device, comprising the flexible display substrate according to claim 1.

10. A method for fabricating a flexible display substrate, comprising:
    preparing a flexible substrate;
    forming a gate, a source and drain, and a plurality of conductive wirings on the flexible substrate; and
    in a bending area of the flexible display substrate, forming a plurality of grooves in each conductive wiring of the plurality of conductive wirings, wherein in a direction perpendicular to a surface of the flexible substrate, each conductive wiring has a dimension at the plurality of grooves smaller than a dimension at a remaining region of the bending area, and in a direction parallel with the surface of the flexible substrate and perpendicular to an extending direction of each conductive wiring, each conductive wiring has a constant dimension.

11. The method according to claim 10, wherein the grooves have a depth which is 10%-90% of a thickness of the conductive wirings.

12. The method according to claim 10, wherein the grooves have a width which is 10%-90% of a width of the conductive wirings.

13. The method according to claim 10, wherein forming the gate, the source and drain and the plurality of conductive wirings on the flexible substrate comprises:
    at a same time as forming the source and drain or the gate, forming the plurality of conductive wirings.

* * * * *